(12) United States Patent
Elzinga

(10) Patent No.: US 8,373,194 B2
(45) Date of Patent: Feb. 12, 2013

(54) SUPPORT MODULE FOR A SOLID STATE LIGHT SOURCE, A LIGHTING DEVICE COMPRISING SUCH A MODULE, AND A METHOD FOR MANUFACTURING SUCH A LIGHTING DEVICE

(75) Inventor: Marcus Johannes Gerardus Elzinga, Roosendaal (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 220 days.

(21) Appl. No.: 13/000,042

(22) PCT Filed: Jun. 23, 2009

(86) PCT No.: PCT/IB2009/052687
§ 371 (c)(1),
(2), (4) Date: Dec. 20, 2010

(87) PCT Pub. No.: WO2010/001300
PCT Pub. Date: Jan. 7, 2010

(65) Prior Publication Data
US 2011/0101411 A1 May 5, 2011

(30) Foreign Application Priority Data
Jul. 3, 2008 (EP) .................................. 08159568

(51) Int. Cl.
*H01L 33/36* (2010.01)
*H01L 21/00* (2006.01)
(52) U.S. Cl. ............... 257/99; 438/26; 257/E33.056; 257/E33.058; 257/E33.066
(58) Field of Classification Search .............. 257/99, 257/E33.056, E33.058, E33.066; 438/26
See application file for complete search history.

(56) References Cited

U.S. PATENT DOCUMENTS

| 4,742,432 | A | 5/1988 | Thillays et al. |
| 5,564,819 | A * | 10/1996 | Yamaguchi ................... 362/241 |
| 7,540,634 | B2 * | 6/2009 | Belek ............................ 362/294 |
| 7,677,899 | B2 * | 3/2010 | Low ................................ 439/56 |

(Continued)

FOREIGN PATENT DOCUMENTS

| DE | 202006018985 U1 | 3/2007 |
| EP | 1463391 A1 | 9/2004 |
| JP | 05226698 | 9/1993 |
| WO | 2006117711 A1 | 11/2006 |
| WO | 2007078103 A1 | 7/2007 |

*Primary Examiner* — Evan Pert
(74) *Attorney, Agent, or Firm* — Mark L. Beloborodov

(57) ABSTRACT

A support module (1), comprising a conducting layer (2) having a trough hole (5) and a receiving surface adapted to receive a solid state light source (3) with the electrical contact pad (4) being aligned with the through hole (5). The support module (1) further comprises an electrical insulation element (8) and at least one contact pin (9), extending through the electrical insulation element (8), and protruding through the through hole (5). Furthermore, the electrical insulation element (8) comprises a channel (10) allowing access to the end of the contact pin (9) and the electrical contact pad (4) of the solid state light source (3) received by the surface of the conducting layer (2). Such a channel makes it possible to reach the end of the contact pin and the contact pad through the insulation element with a soldering tool. Thus, it is possible to attach the solid state light source on a metal surface by soldering the contact pin to the contact pad. Mounting a solid state lighting device on a metal surface is advantageous in applications requiring good heat dissipation, since the heat dissipation properties of a metal surface is better than of a printed circuit board.

8 Claims, 2 Drawing Sheets

U.S. PATENT DOCUMENTS

2006/0189124 A1  8/2006  Beer et al.

2007/0284602 A1  12/2007  Chitnis et al.

* cited by examiner

SUPPORT MODULE FOR A SOLID STATE LIGHT SOURCE, A LIGHTING DEVICE COMPRISING SUCH A MODULE, AND A METHOD FOR MANUFACTURING SUCH A LIGHTING DEVICE

FIELD OF THE INVENTION

The invention relates to a support module for a solid state light source, which support module is adapted to receive the solid state light source with an electrical contact pad facing the conducting layer.

BACKGROUND OF THE INVENTION

A solid state light source, such as a light-emitting diode, of a surface mounted type has contact pads for heat transfer and electrical connections. The contact pads, which are generally designed for attaching the solid state light source on a printed circuit board, are typically located on a non-lighting side of the solid state light source, which is intended to be attached to the printed circuit board.

The surface type solid state light source is typically attached to the printed circuit board by soldering. For instance, in large scale applications reflow soldering may be used.

However, within some applications it may be desirable to attach the surface mount solid state light source on other objects than a printed circuit board, for example a metal surface. This gives rise to problems, since it is not possible to use reflow soldering, as the solder material may flow over the whole metal surface, and consequently short-circuit the surface mount solid state light source. Further, since the object covers the contact pads of the solid state light source, they are not accessible with conventional soldering tools, such as a soldering iron or a soldering gun. Thus, soldering the solid state light source on the object is problematic.

SUMMARY OF THE INVENTION

The object of the present invention is to provide a support module for a solid state light source, which overcomes the abovementioned problems.

The above object is achieved by a support module which has the features defined in the appended claims.

A support module according to the present invention comprises a conducting layer having a through hole and a receiving surface, which is adapted to receive the solid state light source with the electrical contact pad facing the surface and being aligned with the through hole. The support module further comprises an electrical insulation element, which is arranged on a reverse side of the conducting layer in relation to the receiving surface intended to receive the solid state light source; and at least one contact pin, which extends through the electrical insulation element, and has one end protruding through the through hole, which end is adapted to be brought in contact with the electrical contact pad on the solid state light source. The electrical insulation element comprises a channel allowing access to the end of the contact pin and the electrical contact pad of the solid state light source received by the surface of the conducting layer.

Such a channel makes it possible to access the end of the contact pin and the electrical contact pad through the insulation element with a soldering tool, such as a laser, a soldering iron, a soldering gun, or a torch, or a hot-air pencil. Thus, it is possible to attach the solid state light source on a metal surface by soldering the contact pin to the contact pad. The through hole of the conducting layer prevents short-circuiting of the electrical contact pad by mechanical contact with the surrounding conducting layer. Further, the electrical insulation element acts as a carrier for the contact pin. Mounting a solid state lighting device on a metal surface is advantageous in applications requiring good heat dissipation, since the heat dissipation properties of a metal surface is better than of a printed circuit board.

Preferably, the support module further comprises a cylindrical element, which is connected to, or forms an integral part of the conducting layer, forming a cup-shaped socket together with the conducting layer. Such a cup-shaped socket is suitable for manufacturing reasons; since it makes it possible to easily attach the electrical insulation element to the conducting surface by insert moulding or co-moulding. Suitably, the insulation element is formed inside the cup-shaped socket by such a moulding technique.

In a preferred embodiment the insulation element is adapted to mechanically secure the contact pin. A mechanically secured contact pin decreases the stress on the soldered joint between the contact pin and the contact pad on the solid state light source.

Moreover, the support module according to the present invention may advantageously be comprised in a solid state lighting device, further comprising a solid state light source, such as a light emitting diode, arranged on the surface of the conducting layer so that the electrical contact pad is connected to the end of the contact pin. Such a solid state lighting device is advantageous, since it is easy to replace in contrast to a solid state light source. The lighting device may be incorporated in an illuminaire.

A further object of the invention is to provide a method for manufacturing a solid state lighting device, comprising the steps of: providing a support module including a conducting layer having a through hole and a receiving surface, an electrical insulation element, arranged on a reverse side of the conducting layer in relation to the surface intended to receive the solid state light source, at least one contact pin, extending through the electrical insulation element, and having one end protruding through the through hole, and a channel through the electrical insulation element; arranging a solid state light source on the surface of the conducting layer so that the contact pad faces the receiving surface and is aligned with the through hole and the end of the contact pin; accessing the end of the contact pin and the contact pad through the channel with a tool; and electrically connecting the end of the contact pin to the contact pad using the tool.

Suitably, the end of the contact pin is electrically connected to the contact pad by soldering. Preferably, the method further comprises the step of filling the channel with a suitable material. This may be advantageous, in order to prevent gasses from the insulation element to reach the solid state light source.

It is noted that the invention relates to all possible combinations of features recited in the claims.

BRIEF DESCRIPTION OF THE DRAWINGS

The above, as well as additional objects, features and advantages of the present invention will be better understood through the following illustrative and non-limiting detailed description of preferred embodiments of the present invention, with reference to the appended drawings, where the same reference numerals will be used for similar elements.

DETAILED DESCRIPTION OF EMBODIMENTS

The present invention will be described in more detail below with reference to the accompanying schematic drawings, which for the purpose of illustration show a currently preferred embodiment.

Figure 1A:
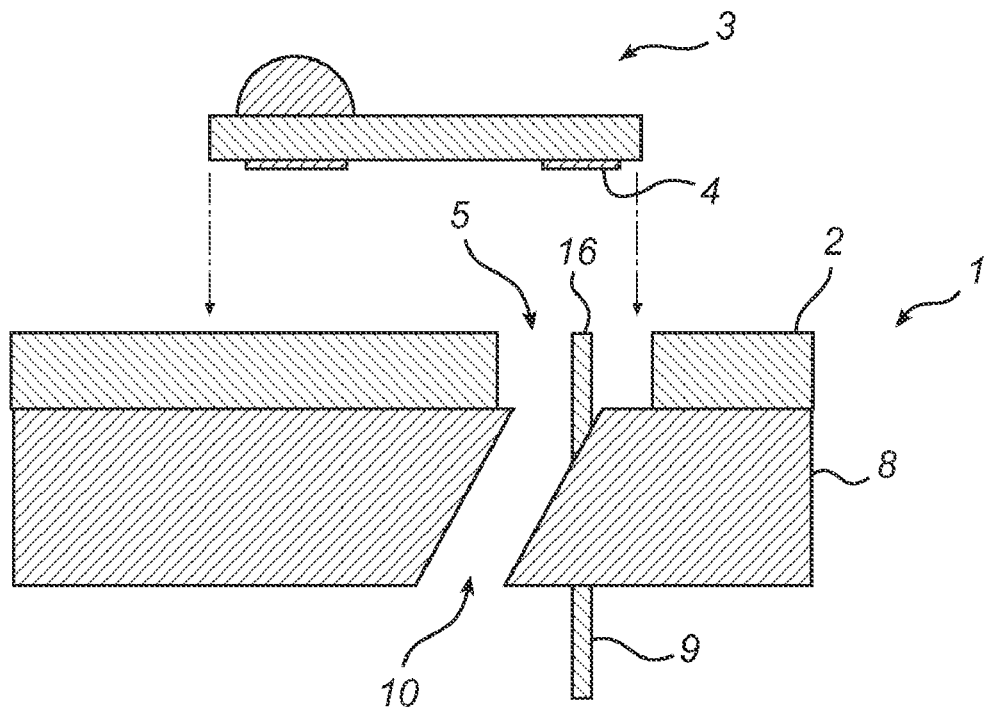
FIG. 1a is a schematic cross-sectional side view of a support module and a solid state light source.

The support module 1, which is illustrated in FIG. 1a, comprises a conducting layer 2, which may consist of a suitable conductive material, such as a metal, for instance aluminium. The conducting layer 2 may have any suitable or desired dimension and form, such as quadrilateral, circular, elliptical, etc., as well as be of any suitable thickness. The conducting layer 2 has a receiving surface, which is adapted to receive a solid state light source 3 having at least one electrical contact pad 4 on one side. In a preferred embodiment, there are two contact pads 4, but also other number of contact pads 4 is possible. The conducting layer 2 comprises a through hole 5 having a cross-section area, which is larger than the total area accommodating the contact pads 4 on the solid state light source 3. Alternatively, the conducting layer 2 may comprise one through hole 5 for each contact pad on the solid state light source 3. In that case, the cross-section area of each through hole 5 is larger than the area of each contact pad 4 on the solid state light source 3. In still another embodiment, the conducting layer 2 may comprise a suitable number of through holes 5, in case of the contact pads 4 of the solid state light source 3 being arranged in groups of two or several contact pads 4. For instance, if there are two groups of contact pads 4, each comprising two contact pads 4, a suitable number of trough holes 5 may be two. The dimensions of the through holes 5 in this case correspond to the dimensions of the through holes 5 in the abovementioned cases.

Further, the support module 1 comprises an electrical insulation element 8, arranged on a reverse side of the conducting layer 2, in relation to the surface, which is adapted to receive the solid state light source 3. The electrical insulation element 8, which may be as thick as desired, may be arranged over the whole reverse side of the conducting layer 2 or only a part of it. The insulation element 8 may have any suitable or desired dimension and form. The insulation element 8 consists of a suitable insulation material, for instance some polymer, such as polyethylene, crosslinked polyethylene, polyvinyl chloride, polytetrafluorothylene, or modified ethylene tetrafluoroethylene. Other possible materials are for instance rubber.

Preferably, the electrical insulation element 8 is insert moulded to the conducting layer 2, by placing the conducting layer 2 into a moulding die prior to injection moulding. The injected plastic flows around the conducting layer and locks it permanently into a final moulding. An alternative moulding technique is co-moulding. When using moulding as production technique, the insulation element 8 consists of a suitable polymer.

Further, the electrical insulation element 8 is adapted to act as a carrier for one or several, preferably two, contact pins 9. In a preferred embodiment the insulation element 8 is adapted to mechanically secure the contact pins 9. Each contact pin 9 may be attached to the electrical insulation element 8 during the moulding process, e.g. by providing the moulding die with means for holding the contact pin 9 in place. Alternatively, each contact pin 9 may be pushed through the insulation element 8, if necessary or desired trough a pre-drilled hole. In case of a pre-drilled hole the cross-section area of each pre-drilled hole may be slightly smaller than the cross-section area of the associated contact pin 9, in order to secure the contact pin 9. Alternatively, the contact pins 9 may be secured with a suitable adhesive, such as a hot melt adhesive, by remelting circumferential insulation material, or with a suitable type of mechanical fastening means.

Each contact pin 9, which has one end 16 adapted to be brought in contact with respective contact pad 4 on the solid state light source 3, protrudes through the through hole 5 of the conducting layer 2 and through the electrical insulation element 8, see FIG. 1. In a preferred embodiment, the contact pin 9 extends perpendicularly straight through the insulation element 8 and protrudes suitably outside the electrical insulation element 8, on the reverse side of the insulation element 9. The invention is not limited to contact pins 9 with abovementioned extension and direction, other directions and extensions may also be suitable depending on the application.

The electrical insulation element 8 comprises a channel 10 allowing access to the end 16 of the contact pin 9. The width of the channel 10 is such that access to the contact pin 4 is enabled with a suitable soldering tool. The cross-section of the channel 10 is preferably circular, but may have any other suitable form, such as elliptical, quadrilateral, etc. The channel is inclined with respect to the contact pin, in order to ensure that the contact pin extends outside the channel 10, so as to be secured by the insulation element 8. In addition, the direction is such that access to the end 16 of the contact pin 9 is allowed from the outside. The channel 10 may extend to either a side of the insulation element 8 facing from the conducting layer 2, or to a side of the insulation element 8, which is substantially perpendicular to the conducting layer 2.

Figure 1B:
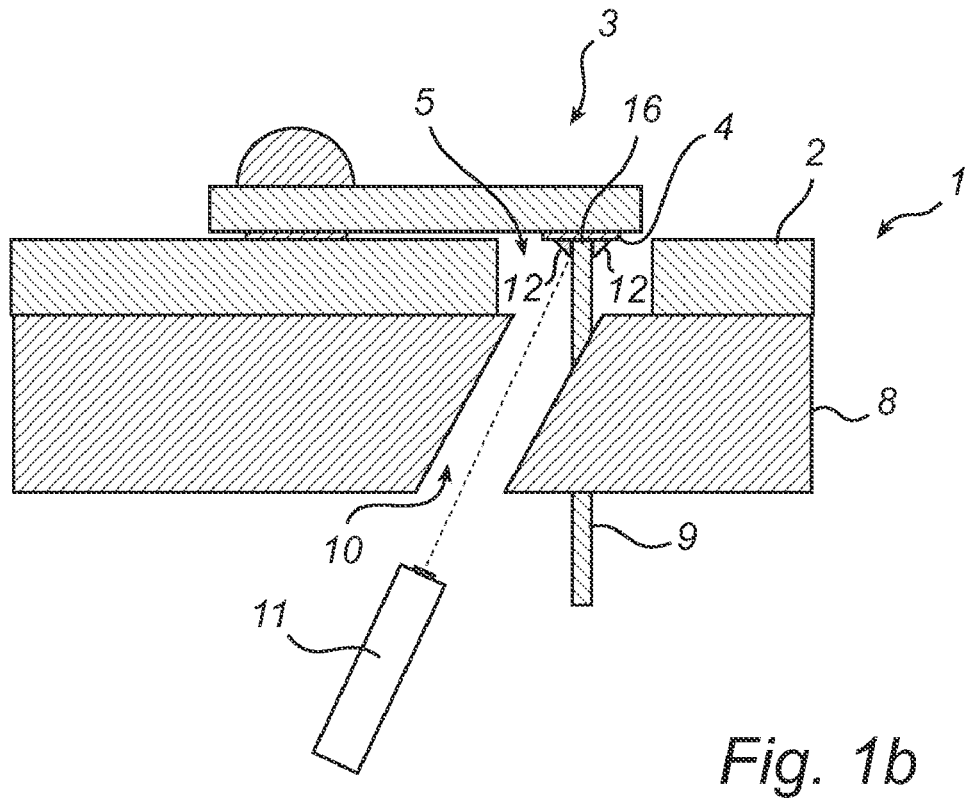
FIG. 1b is a schematic cross-sectional side view of the support module with an attached solid state light source, showing a laser for soldering the solid state light source to the support module.

When mounting a solid state light source 3 on the module, the solid state light source 3 is positioned on the conducting layer 2 in such a way that the contact pads 4 are aligned with the through hole 5 of the conducting layer 2 and not in contact with the conducting layer 2, see FIG. 1b. In case of several through holes 5, the solid state light source 3 is positioned on the conducting layer 2 with each contact pad 4 or group of contact pads 4 positioned in a similar way in relation to respective through hole 5. Since the cross-section area of the through hole 5 of the conducting layer 2 is larger than the total area accommodating the contact pads 4 on the solid state light source 3, the cross-section area is large enough to both accommodate all contact pads 4 of the solid state light source 3, and to prevent the contact pads 4 of the solid state light source 3 from being in physical contact with the conducting layer 2, when the solid state light source 3 is brought in contact with the conducting layer 2. Thus, the through hole 5 prevents short-circuiting the contact pads 4 by contact with the conducting layer 2. In case of several through holes 5, the dimensions of the through holes 5 prevent short-circuiting of the contact pads 4 by contact with the conducting layer 2. When positioning the solid state light source 3 on the conducting layer 2, a thermal pad of the solid state light source 3 may be secured to the conducting layer 2 by using a suitable thermally conductive adhesive.

Thereafter, the contact pad 4, comprising solder paste 12, is connected to the contact pin 9 by soldering through the channel 10, using a suitable soldering tool such as a laser 11, a soldering iron, or a soldering gun, see FIG. 1b. Alternatively, the solder paste may be arranged on the contact pin during the manufacturing process of the support module 1. Thus, a solid state lighting device 15 comprising a support module 1 and a solid state light source 3 arranged on said conducting layer 2, wherein said contact pad 4 is connected to said contact pin 9, is provided, see FIG. 2.

In an alternative embodiment, after mounting the solid state lighting device 3 to the conducting layer 2, the through hole 5 of the conducting layer 2 and the channel 10 is filled with a suitable material, such as a polymer, some type of filler, epoxy or the like. This may be advantageous, in order to prevent gasses from the insulation element 8 to reach the solid state light source 3. Since the solid state light source 3 is arranged on a metal surface, the solid state lighting device 15 possesses good heat dissipation properties. The solid state lighting device 15, is useful in general lighting as well as in automotive lighting applications.

Figure 2:
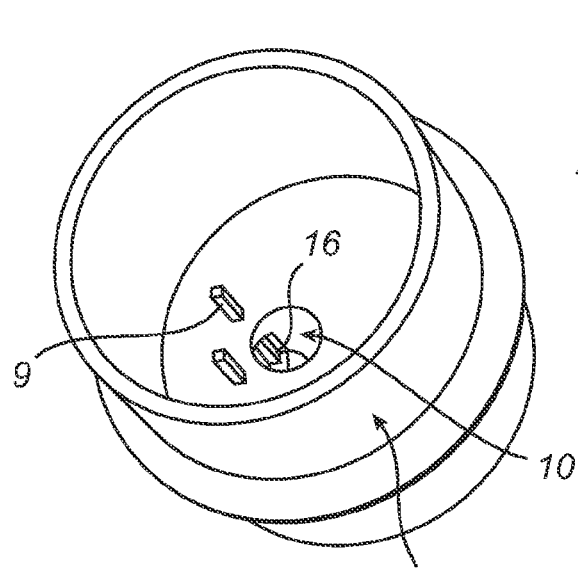
FIG. 2 is a perspective view of an embodiment of the support module in accordance with the present invention.
Figure 3A:
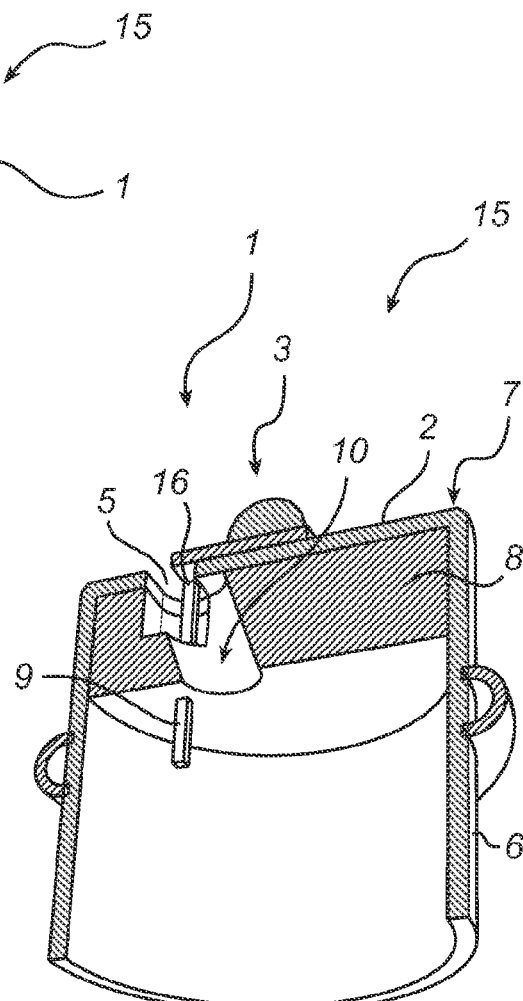
FIG. 3a is a cross-sectional view of the embodiment in FIG. 2.
Figure 3B:
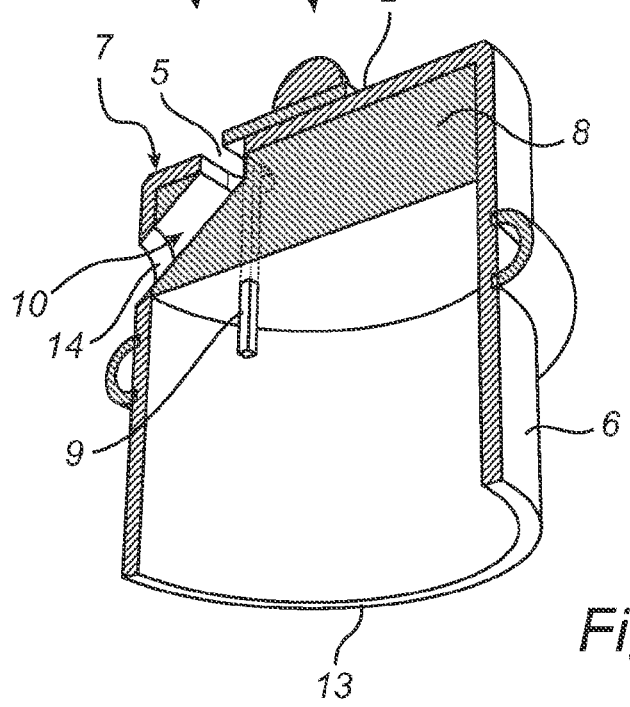
FIG. 3b is a cross-sectional view of an alternative embodiment of present invention.

In a preferred embodiment, the support module 1 further comprises a cylindrical element 6, which is connected to or forms an integral part of the conducting layer 2 see FIGS. 2, 3a, and 3b. Preferably, the cylindrical element 6 is circular cylindrical, and consists of the same material as the conducting layer 2. A circular cylindrical element is advantageous from view of manufacture. Alternatively, the cylindrical element 6 may consist of some other metal or another material with good thermal conductive properties. In case of a separate cylindrical element 6, one end of the cylindrical element 6 faces a side of the conducting layer 2 opposite to the surface intended to receive the solid state light source 3. In that way the cylindrical element 6 together with said conducting layer 2 forms a cup-shaped socket 7, see FIGS. 2, 3a, and 3b. However, the invention is not limited to a straight cylindrical element 6, other forms may also be suitable within the scope of the invention such as a bent cylindrical element 6. The cylindrical element 6 may be located circumferentially around the conducting layer 2, or the conducting layer 2 may cover the end of the cylindrical element 6. The cylindrical element 6 and the conducting layer 2 may be welded together or attached to each other in some other suitable way. If the cylindrical element 6 is located circumferentially around the conducting layer 2, the diameter of the conducting layer 2 may be slightly larger than the inner diameter of the cylindrical element 6, in order to secure the parts to each other. In case of a cylindrical element 6 forming an integral part of the conducting layer 2, the conducting layer 2 and the cylindrical element 6 may be cast in one piece.

In case of the support module 1 comprising a cup-shaped socket 7, the form of the insulation element 8 corresponds to the form enclosed by the cup-shaped socket 7. Preferably, the electrical insulation element 8 is insert moulded to the cup-shaped socket 7. Further, the contact pins 9 in such an embodiment do not preferably extend outside the cylindrical element 6.

In a preferred embodiment comprising a cylindrical element 6, the channel 10 preferably extends to the opposite side of the insulation element 8, with an angle of inclination such that the opening of the channel 10 is accessible through the opposite end 13 of the cylindrical element 6, see FIG. 3a. Alternatively, if the channel 10 is not accessible through the end 13 of the cylindrical element 6, the cylindrical element 6 may have a through hole 14 aligned with the channel 10, in order to provide access to the opening of the channel 10. The through hole 14 may be near the end 13 of the cylindrical element 6, or at any other suitable position on the cylindrical element 6 as long as access to the opening of the channel 10 is provided. Still alternatively, the channel 10 may extend to the peripheral surface of the insulation element 8 and pass through the through hole 14 in the cylindrical element 6, see FIG. 3b. Such a through hole 14 of the cylindrical element 6 may be near the end facing the conducting layer 2 or at any other suitable position on the cylindrical element 6 as long as access to the opening of the channel 10 is provided.

The solid state lighting device 15 comprising a cylindrical element 6 is intended to be mounted as a plug in suitable a socket (not shown) on the structure to which the solid state lighting device 15 is intended to be mounted. Hence, the solid state lighting device 15 is easy to replace in a lamp-like way, in contrast to conventional solid state light sources.

Although the invention above has been described in connection with preferred embodiments of the invention, it will be evident for a person skilled in the art that several modifications are conceivable without departing from the invention as defined by the following claims.

The invention claimed is:

1. A support module for a solid state light source having at least one electrical contact pad, the module comprising:
   a conducting layer defining a through hole and having a receiving surface for receiving the solid state light source with the electrical contact pad facing the surface and being disposed over said through hole;
   an electrical insulation element arranged on an opposite side of the conducting layer in relation to the receiving surface; and
   at least one contact pin extending through the electrical insulation element and having one end protruding through said through hole and adapted to be brought into contact with the electrical contact pad of said solid state light source when received by the surface of the conducting layer, wherein said electrical insulation element defines a channel for providing access to said end of the contact pin and the electrical contact pad of said solid state light source received by the surface of the conducting layer.

2. The support module according to claim 1, further comprising a cylindrical element connected to the conducting layer, forming a cup-shaped socket together with the conducting layer.

3. The support module according to claim 2, wherein the insulation element is formed inside said cup-shaped socket by insert moulding or co-moulding.

4. The support module according to claim 1, wherein the insulation element is configured to mechanically secure the contact pin.

5. A lighting device, comprising
   a support module for a solid state light source having at least one electrical contact pad, the support module comprising
      a conducting layer defining a through hole and having a receiving surface for receiving the solid state light source with the electrical contact pad facing the surface and being disposed over said through hole;
      an electrical insulation element arranged on an opposite side of the conducting layer in relation to the receiving surface; and
      at least one contact pin extending through the electrical insulation element and having one end protruding through said through hole and adapted to be brought into contact with the electrical contact pad of said solid state light source when received by the surface of the conducting layer, wherein said electrical insulation element defines a channel for providing access to said end of the contact pin and the electrical contact pad of said solid state light source received by the surface of the conducting layer; and a solid state light source arranged on the surface of the conducting layer so that the electrical contact pad is electrically connected to said end of the contact pin.

6. A method for manufacturing a solid state lighting device, comprising the steps of:
provided a support module including:
a conducting layer defining a through hole and having a receiving surface;
an electrical insulation element arranged on an opposite side of the conducting layer in relation to the receiving surface;
at least one contact pin, extending through the electrical insulation element, and having one end protruding through said through hole; the electrical insulation element defining a channel therethrough for providing access to said end of the contact pin;

arranging a solid state light source on the receiving surface of the conducting layer so that an electrical contact pad of said solid state light source faces the receiving surface and is substantially aligned with the through hole;
accessing said end of the contact pin and the electrical contact pad through said channel; and
electrically connecting said end of the contact pin to the electrical contact pad.

7. The method according to claim 6, wherein said end of the contact pin is electrically connected to the electrical contact pad by soldering.

8. The method according to claim 6, further comprising the step of filling the channel with a sealing material.

* * * * *